United States Patent
Kook et al.

(10) Patent No.: US 6,327,204 B1
(45) Date of Patent: Dec. 4, 2001

(54) METHOD OF STORING INFORMATION IN A MEMORY CELL

(75) Inventors: Jeong Hoon Kook, Seoul; Hoi Jun Yoo, Taejon, both of (KR)

(73) Assignee: Korea Advanced Institute of Science and Technology, Taejon (KR)

(*) Notice: Subject to any disclaimer, the term of this patent is extended or adjusted under 35 U.S.C. 154(b) by 0 days.

(21) Appl. No.: 09/722,023

(22) Filed: Nov. 27, 2000

(30) Foreign Application Priority Data

Mar. 28, 2000 (KR) .................................................. 00-15697

(51) Int. Cl.[7] .................................................. G11C 13/00
(52) U.S. Cl. ................ 365/207; 365/189.05; 365/185.21
(58) Field of Search ........................ 365/185.21, 189.01, 365/189.05, 230.01, 207

(56) References Cited

U.S. PATENT DOCUMENTS 3,805,254 * 4/1974 Schuur ............................. 365/189.01
4,758,987    7/1988 Sakui .................................... 365/189
5,243,560    9/1993 Amishiro et al. ............... 365/189.01

* cited by examiner

*Primary Examiner*—Terrell W. Fears
(74) *Attorney, Agent, or Firm*—Foley & Lardner

(57) ABSTRACT

A method of storing information in a memory cell. The method writes information via only the bit-line that is connected to a memory cell with respect to a word-line, and thus reduces the overall power consumption in the memory by reducing the unnecessary power consumption occurring from the change of voltage level in the bit-line that is not connected to a memory cell. To this end, a method of storing information in a memory cell having a sense amplifier which differentially amplifies a difference in voltage level between a pair of bit-lines is provided, the method comprising the steps of activating a word-line connected to the memory cell to be accessed, differentially amplifying the difference in voltage level between the pair of bit-lines coupled to the memory cell to be accessed, and selecting only one bit-line that is connected to the memory cell among the pair of bit-lines and rewriting the information via the one bit-line.

2 Claims, 6 Drawing Sheets

METHOD OF STORING INFORMATION IN A MEMORY CELL

BACKGROUND OF THE INVENTION

1. Field of the Invention

The present invention relates to a method of storing information in a memory cell and, more particularly, to a method of storing information by way of single bit-line rewriting (SBR).

2. Description of the Prior Art

Recently, the demand for battery-operated devices such as hand-held communication devices or personal digital assistants has increased dramatically. Accordingly, continued effort is being made to extend the battery life of these devices. As the memory used in these hand-held communication devices gets larger, it becomes more and more important to reduce the power consumption in the memory.

In general, when reading and writing from/to a memory system by activating a word line, the active device coupled to the word line become conductive as the word line becomes active, and the passive device coupled to the active device outputs information stored therein in the form of charges by way of current-flow via the bit-line, so that a small change in the bit-line voltage level occurs. At this time, the information in the memory cell is destroyed. Thus, it is necessary to have a circuit that senses the small change in the bit-line voltage and amplifies the sensed signal, and a circuit that rewrites the amplified information to the memory cell. Most commercial dynamic random access memories (DRAMs) use sense amplifiers that are capable of differential amplification. The sense amplifiers amplify the difference in voltage between the bit-lines BL and /BL and recharge the bit-lines BL and /BL to a full Vcc level, and write this restored voltage to the memory cell. Thereafter, the word-line is deactivated and the pair of bit-lines BL and /BL that is at full Vcc level becomes precharged to half Vcc (Vcc/2) level for the next read/write operation. Thus, there is power consumption occurring from the change in voltage level in the bit lines between the precharge (Vcc/2) voltage level and full Vcc voltage level whenever a DRAM is accessed.

SUMMARY OF THE INVENTION

Therefore, it is an object of the present invention to provide a method of reducing the overall power consumption in memory devices by reducing unnecessary power consumption occurring from the change of voltage levels in bit lines that are not connected to a cell, by way of implementing a structure wherein information is stored via only a bit-line that is connected to the memory cell with respect to a word-line.

To this end, a method of storing information in a memory cell having a sense amplifier that differentially amplifies a difference in voltage level between a pair of bit-lines is provided, the method comprising the steps of activating a word-line connected to the memory cell to be accessed, differentially amplifying the difference in voltage level between the pair of bit-lines coupled to the memory cell to be accessed, and selecting only one bit-line that is connected to the memory cell among the pair of bit-lines and rewriting the information via said one bit-line.

DESCRIPTION OF THE PREFERRED EMBODIMENT

Preferred embodiments of the invention will be described hereinafter with reference to the drawings.

Generally, commercial DRAMs use 1-transistor cells comprising a single transistor and a single capacitor because this structure is most preferable in terms of number of devices, amount of wiring, and chip size. With respect to the structure of bit-lines, folded bit-line structures are commonly used in order to prevent the diminution of amplification margins due to coupling noise generated from the change of voltage levels in the word-lines.

Figure 1:
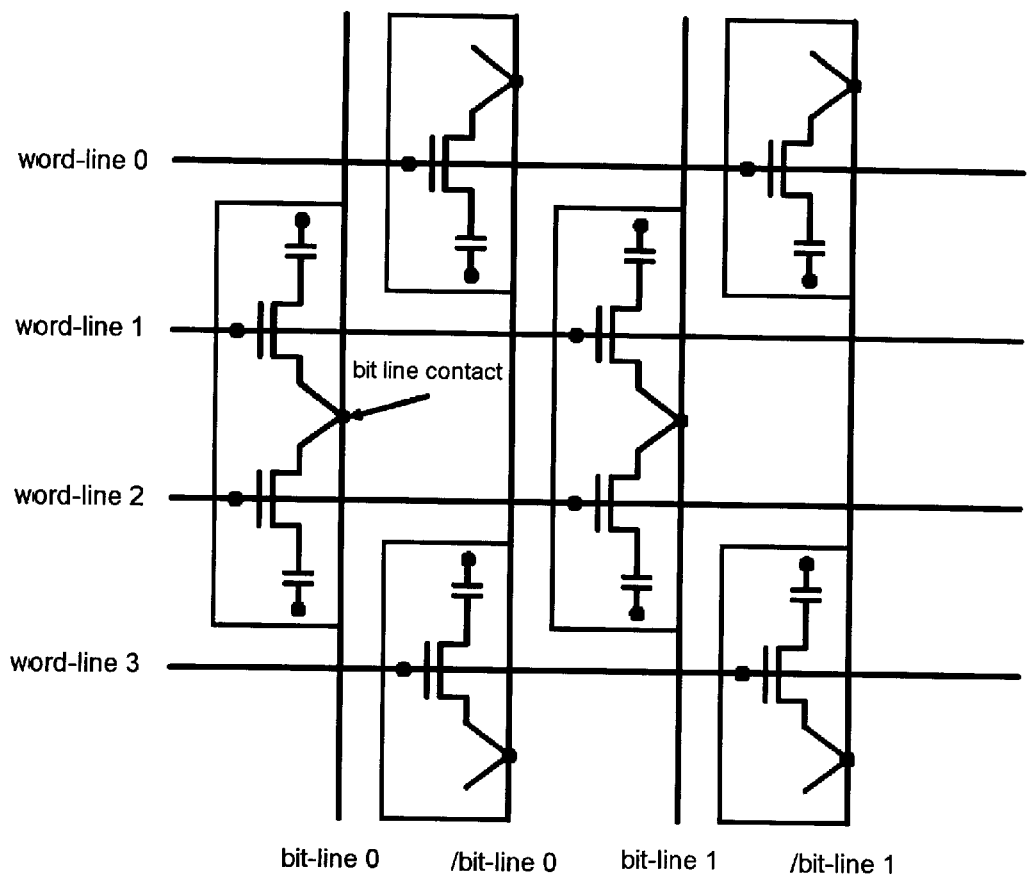
FIG. 1 is a diagram showing an example of a 1-transistor cell array with a folded bit-line structure.
Figure 2:
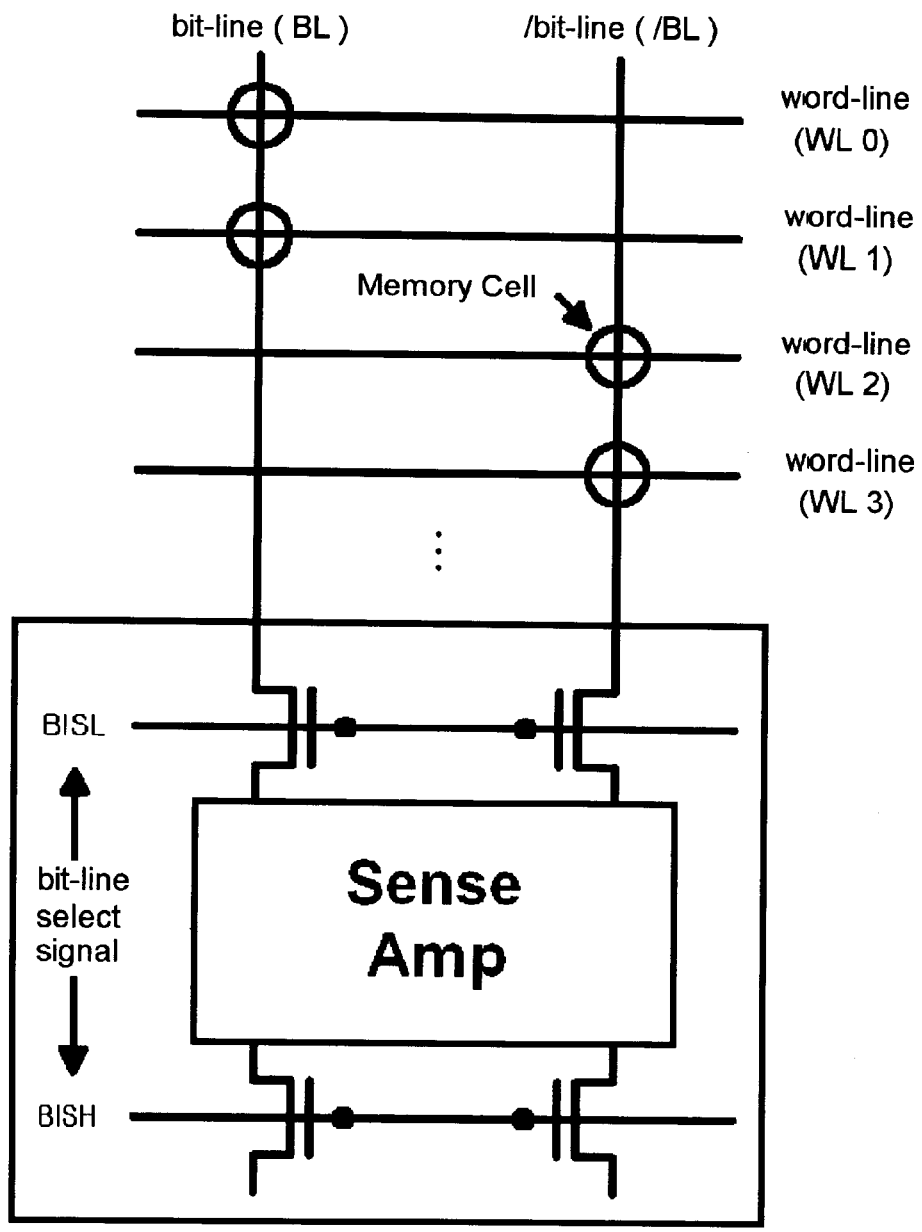
FIG. 2 is a diagram showing an example of the conventional arrangement of the bit-line select signal.

FIG. 1 is a diagram showing an example of a 1-transistor cell array with a folded bit-line structure, and FIG. 2 is a diagram showing an example of the conventional arrangement of the bit-line select signal.

Referring to FIG. 1, the 1-transistor cell array with a folded bit-line structure includes memory cells consisting of a single transistor and a single capacitor, word-lines coupled to the memory cells so as to activate the memory cells, bit-lines coupled to the memory cells so as to input/output information to/from the memory cells. In order to minimize the size of the cell array, two cells are connected to the bit-lines via a common bit-line contact. The two memory cells are connected to either bit-line BL or bit-line /BL (BIT-LINE 0, /BIT-LINE 0, BIT-LINE 1, or /BIT-LINE 1). The arrangement as shown in FIG. 1 is repeated for every four word-lines.

With the advent of 16 Megabit DRAMs having smaller cell sizes, the structure as shown in FIG. 2 was adopted, and the upper cell array and the lower cell array share the sense amplifier in common (shared sense amplifier structure). In this structure, two bit-line select signals BISL and BISH are used to select either one of the two adjacent upper and lower cell arrays.

The read operation of the memory having a structure as shown in FIG. 2 will now be illustrated. The precharged bit-line BL shares the charges with the memory cell. Thus, the bit-line BL that is connected to a cell shows a small change in voltage level. However, the bit-line /BL which is not connected to a cell maintains its precharged voltage. At this point, the sense amplifier SA is activated, the voltage levels in the bit-lines BL and /BL are shifted to full Vcc level, and the information in the cell is restored. Thereafter, the word-line is deactivated and the bit-lines BL and /BL are precharged for the next read operation. In this operation, the change of voltage level in the bit-line /BL to full Vcc level and the precharging of the bit-line /BL is unnecessary for storing information, because bit-line /BL is not connected to a cell and only one bit-line BL is connected to a cell.

The present invention reduces power consumption of memory devices by changing the voltage level of only the bit-line that is connected to a cell, considering that it is possible to identify the location of the bit-line connected to a cell when the word-line is activated. The location of the bit-line connected to a cell can be easily identified, when the memory address is decoded in order to determine the word-line to be activated. Once the word-line to be activated is determined, it is possible to identify the location of the bit-line connected to a cell.

The method of storing information using only one bit-line according to an embodiment of the present invention will now be illustrated.

Figure 3:
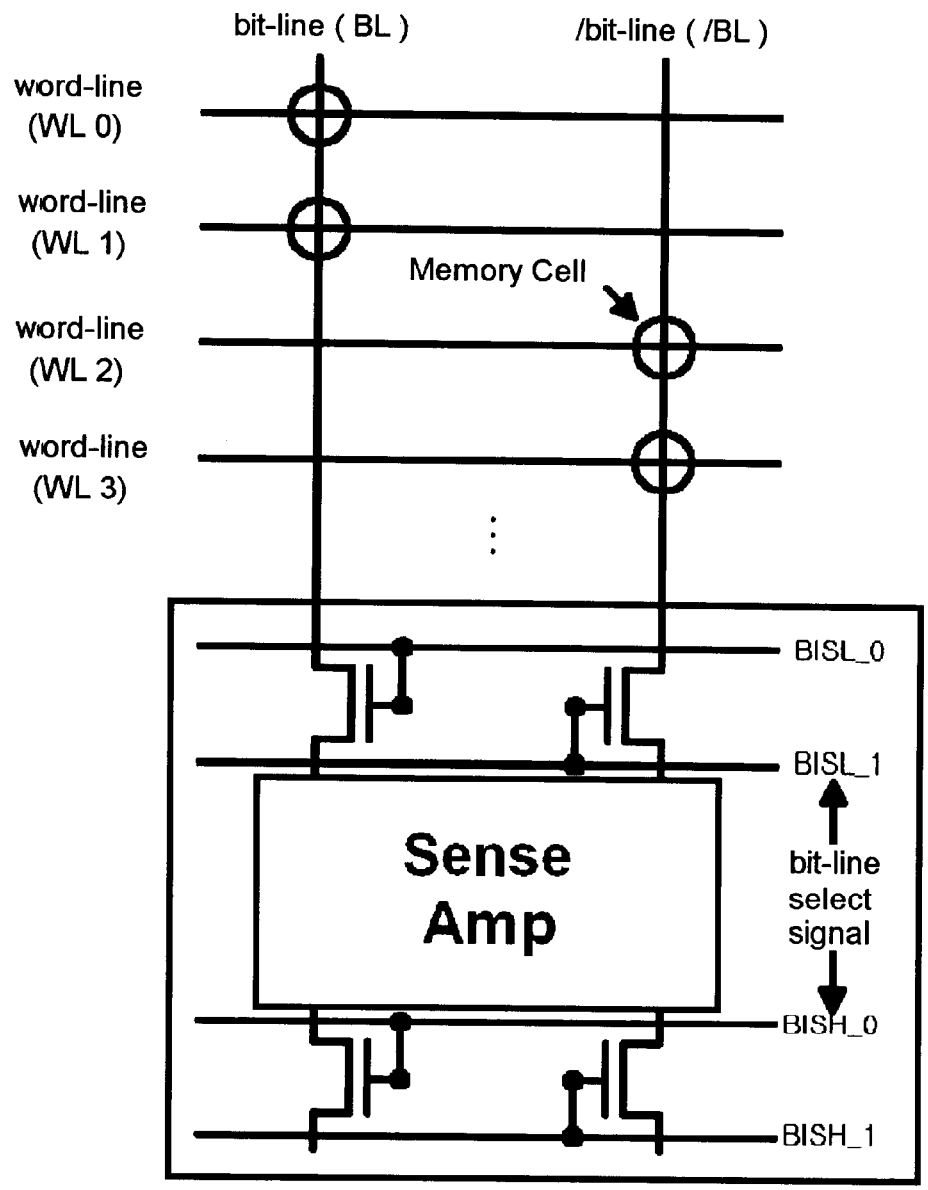
FIG. 3 is a diagram showing an example of the arrangement of the bit-line select signal according to an embodiment of the present invention.
Figure 4:
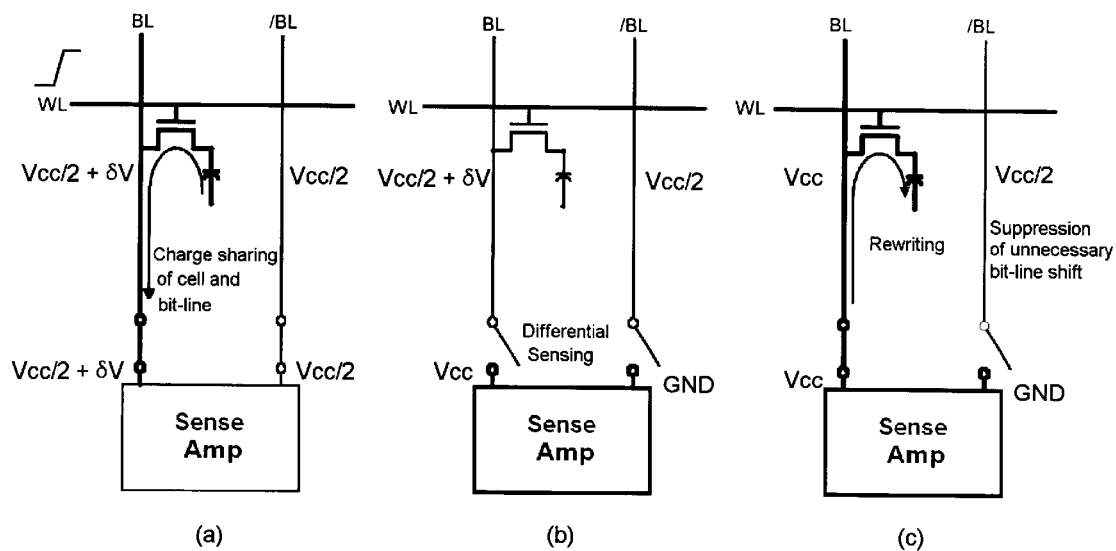
FIG. 4 is a diagram illustrating an information storage operation via a single bit-line according to an embodiment of the present invention.

FIG. 3 is a diagram showing an example of the arrangement of the bit-line (BL) select signal for Single Bit-line Rewriting (SBR) according to an embodiment of the present invention, and FIG. 4 is a diagram illustrating an information storage operation via a single bit-line according to an embodiment of the present invention.

As shown in FIG. 3, the bit-line select signals BISL_0, BISL_1, BISH_0, and BISH_1 for SBR are coupled to the respective ones of switching devices that are connected between the bit-lines BL and /BL and the sense amplifier SA to select either one of the two adjacent upper and lower cell arrays arranged above and below the sense amplifier SA. This structure is obtained by adding one signal line to the conventional memory structure as shown in FIG. 2, and does not result in increase of the cell array area. The bit-line select signal of FIG. 2 functions simply to connect the sense amplifier SA to either one of the upper and lower cell arrays. However, the bit-line select signal of the present invention is capable of controlling each of the bit-lines BL and /BL.

Referring to FIG. 4, the operation of a memory having the structure of FIG. 3 will now be illustrated.

First, the bit-lines BL and /BL must be precharged, generally to Vcc/2, in order to read the information stored in the cell. When voltage is applied to the word-line WL as shown in (a) of FIG. 4, the transistor in the cell becomes conductive. Thus, the bit-line BL connected to the cell shares the charges stored in the capacitor, resulting in a small voltage difference dv between the bit-lines BL and /BL. On the other hand, the bit-line /BL which is not connected to the cell maintains its precharge voltage Vcc/2.

After the word-line WL is activated, the switching devices connected between the bit-lines BL and /BL and the sense amplifier SA are switched off as shown in (b) of FIG. 4 so as to separate the cell memory from the sense amplifier SA, and the sense amplifier SA is activated. The operation of switching off the switching devices can be controlled by the bit-line select signals BISL_0 and BISL_1. By activating the sense amplifier SA, the voltage at the node of the sense amplifier SA is restored to full Vcc level and the voltages on the bit-lines are maintained without change.

Because information has been impaired in the process of reading the information in the cell, it is necessary to rewrite the amplified information to the cell. Accordingly, as shown in (c) of FIG. 4, the switching device coupled to the bit-line BL connected to the cell is switched on to store information in the cell, and the bit-line /BL which is not connected to the cell maintains its voltage level Vcc/2. Thereafter, the word-line is deactivated and the bit-lines BL and /BL are precharged to Vcc/2 in preparation for the next operation. In this entire process, the bit-line /BL which is not connected to the cell maintains its voltage level Vcc/2, so that power consumption in the bit-line /BL is almost zero.

Figure 5:
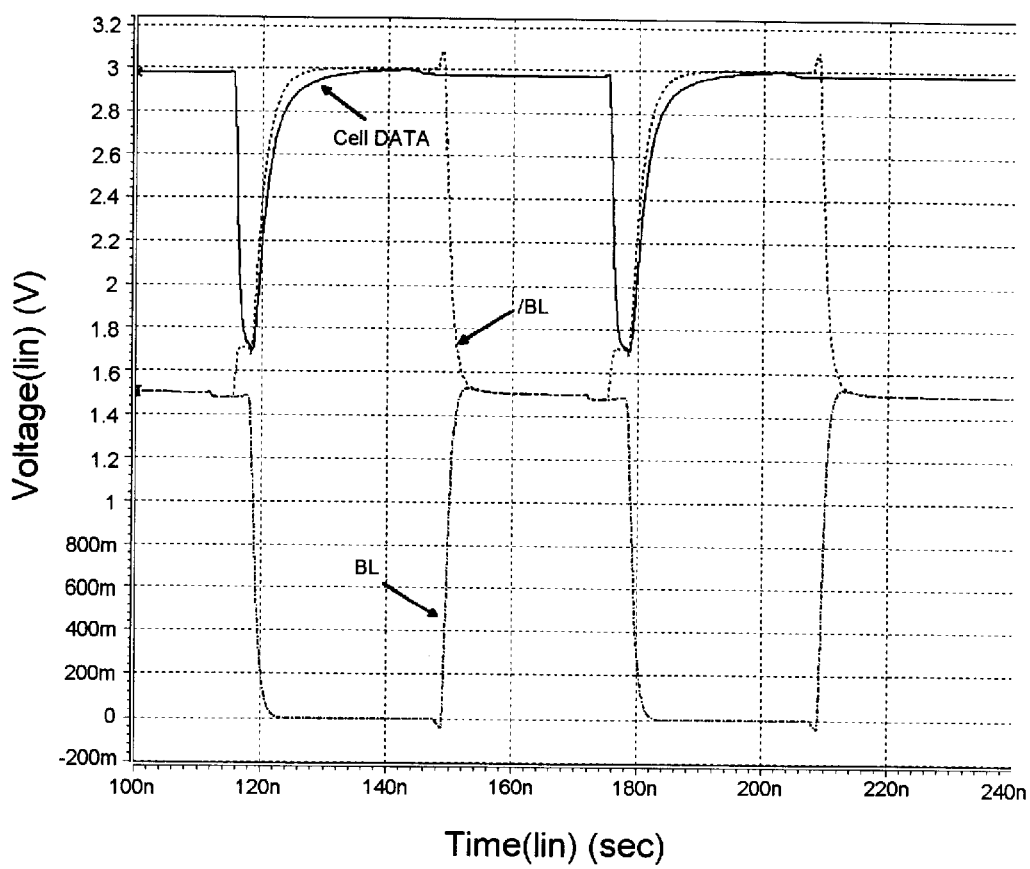
FIG. 5 is a diagram showing the change of voltage level in the bit-line in a memory structure implementing the arrangement of the bit-line select signal of FIG. 2.
Figure 6:
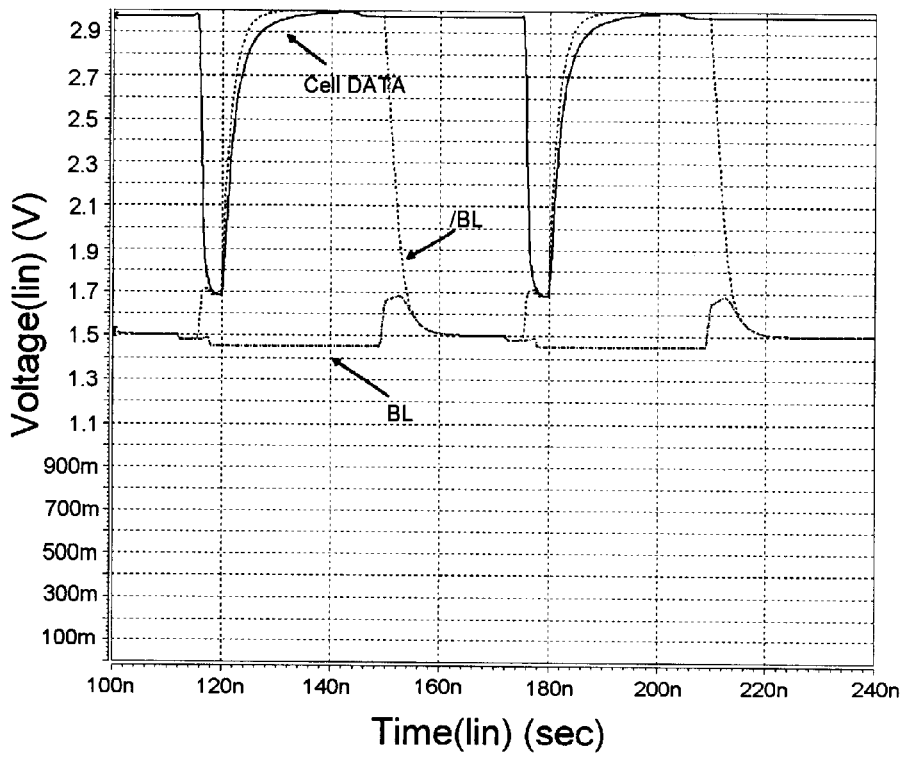
FIG. 6 is a diagram showing the change of voltage level in the bit-line according to an embodiment of the present invention.
Figure 7:
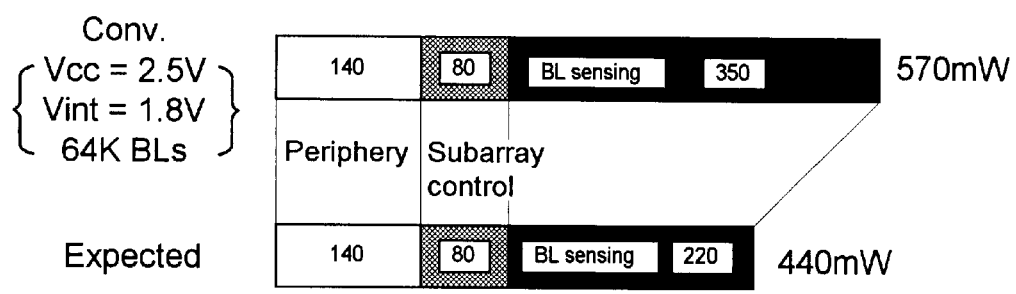
FIG. 7 is a diagram illustrating the reduction of power consumption when using the information storage operation via a single bit-line according to an embodiment of the present invention.

FIG. 5 is a diagram showing the changes of voltage level in the bit-line in a memory structure implementing the arrangement of the bit-line select signal of FIG. 2, FIG. 6 is a diagram showing the changes of voltage level in the bit-line according to an embodiment of the present invention, and FIG. 7 is a diagram illustrating the reduction of power consumption when using the information storage operation via a single bit-line (BL) according to an embodiment of the present invention. FIG. 5 shows that there is power consumption in the bit-line BL or /BL that is not connected to a cell because its voltage level shifts between Vcc/2 and Vcc or GND and Vcc/2. However, if information is stored via only a single bit-line, then power consumption is reduced by 35% as shown FIGS. 6 and 7 compared with that in the conventional memory structure.

Therefore, the present invention can prevent unnecessary power consumption in memory without significant change in the memory structure, and can be used along with conventional low power consumption techniques without additional increase in chip size.

As illustrated above, the present invention has the advantage of preventing power consumption during memory access occurring from the change of voltage level between the precharge voltage and the operation voltage Vcc, by preventing the unnecessary change of voltage level in the bit-line that is not connected to a cell.

Also, the present invention reduces power consumption in the bit-lines, which constitutes a significant portion of power consumption in DRAMs, by simple control of signals without increase in chip size or change in memory structure, and can be used along with other low power consumption techniques.

What is claimed is:

1. A method of storing information in a memory cell having a sense amplifier differentially amplifying a difference in voltage level in a pair of bit-lines, and switching devices coupled between respective ones of the pair of bit-lines and the sense amplifier, the method comprising the steps of:

controlling the switching the devices to connect the bit-lines with the sense amplifier and activating the word-line connected to the memory cell to be accessed;

disconnecting the bit-lines and the sense amplifier and differentially amplifying the difference in voltage level between the pair of bit-lines; and controlling the switching devices to connect the sense amplifier with only one bit-line that is connected to the memory cell among the pair of bit-lines and rewriting the information.

2. The method of storing information in a memory cell as claimed in claim 1, the method further comprising the step of amplifying cell data during writing operation and rewriting the cell data by way of selecting only the bit-line that is connected to the memory cell.

* * * * *